United States Patent [19]
Miyazaki

[11] Patent Number: 5,757,188
[45] Date of Patent: May 26, 1998

[54] MAGNETIC RESONANCE IMAGING APPARATUS WITH FAT SIGNAL SUPPRESSION

[75] Inventor: Mitsue Miyazaki, Otawara, Japan

[73] Assignee: Kabushiki Kaisha Toshiba, Kanagawa-ken, Japan

[21] Appl. No.: 585,618

[22] Filed: Jan. 16, 1996

[30] Foreign Application Priority Data

| Jan. 19, 1995 | [JP] | Japan | 7-006341 |
| Aug. 31, 1995 | [JP] | Japan | 7-224107 |
| Jan. 11, 1996 | [JP] | Japan | 8-002987 |

[51] Int. Cl.$^6$ ................................................. G01N 24/50
[52] U.S. Cl. ........................................................ 324/309
[58] Field of Search ............................... 324/307, 309, 324/300, 313, 314, 316, 310; 128/653.2; 600/410

[56] References Cited

U.S. PATENT DOCUMENTS

| 4,902,973 | 2/1990 | Keren | 324/312 |
| 5,189,371 | 2/1993 | Conolly et al. | 324/309 |
| 5,225,781 | 7/1993 | Glover et al. | 324/309 |
| 5,510,713 | 4/1996 | Bernstein . | |
| 5,528,145 | 6/1996 | Hirata et al. | 324/309 |

*Primary Examiner*—Sandra L. O'Shea
*Assistant Examiner*—Michael Eisenberg
*Attorney, Agent, or Firm*—Limbach & Limbach L.L.P.

[57] ABSTRACT

A magnetic resonance imaging apparatus includes a static magnetic field forming magnet, an RF coil and a transmitter/receiver adapted to transmit a 90° rf pulse and a 180° rf pulse in turn to a human body under examination and receive an echo signal from the human body, gradient magnetic field forming coils and gradient magnetic field power supplies adapted to form a first slice selection gradient magnetic field simultaneously with the 90° rf pulse and a second slice selection gradient magnetic field simultaneously with the 180° rf pulse, a computer system adapted to reconstruct a magnetic resonance image from the echo signal, and a display unit adapted to visualize the reconstructed magnetic resonance image. The frequency bandwidth of the 90° rf pulse is adjusted so that a region in which proton spins in water are excited and a region in which proton spins in fat are excited will not overlap each other. The first and second slice selection magnetic fields are made opposite in polarity to each other. Water proton spins that have been subjected to the 90° rf pulse will also be subjected to the 180° rf pulse, thereby producing a magnetic resonance signal. Fat proton spins that have been subjected to the 90° rf pulse will not be subjected to the 180° rf pulse. The fat proton spins will not produce a magnetic resonance signal.

23 Claims, 11 Drawing Sheets

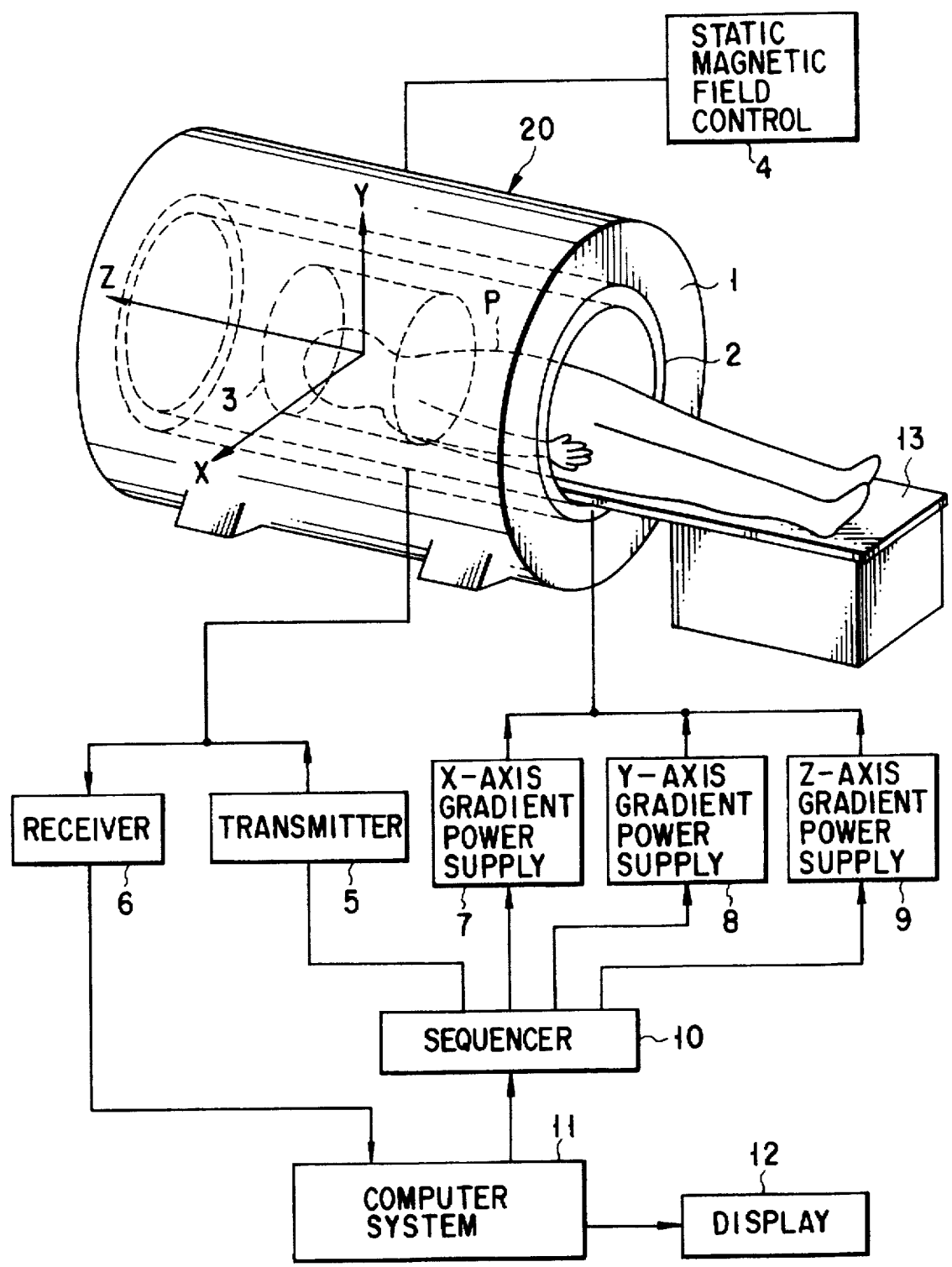
F I G. 4

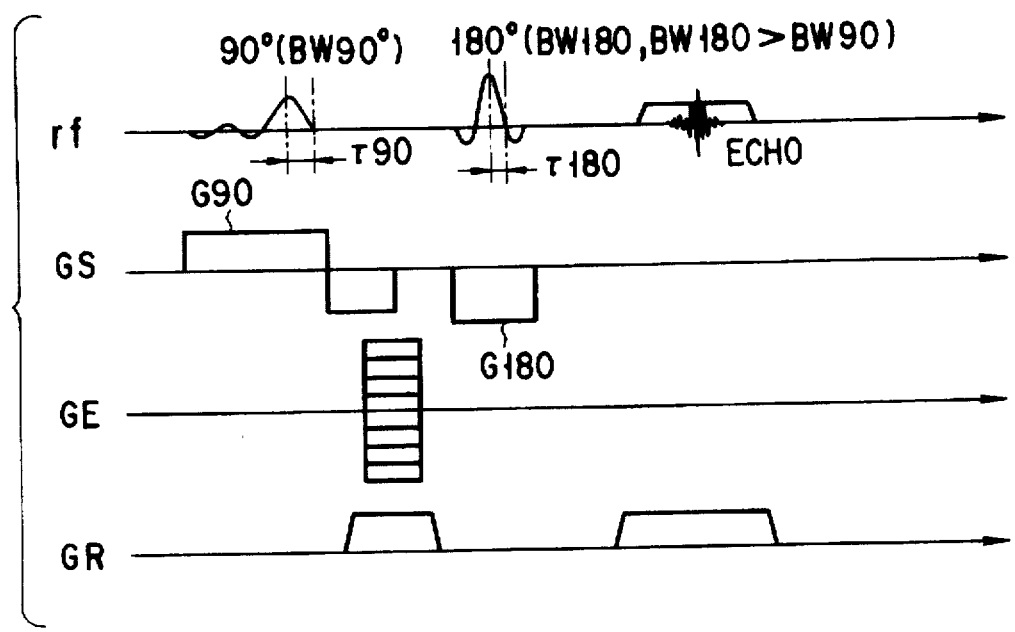
F I G. 5
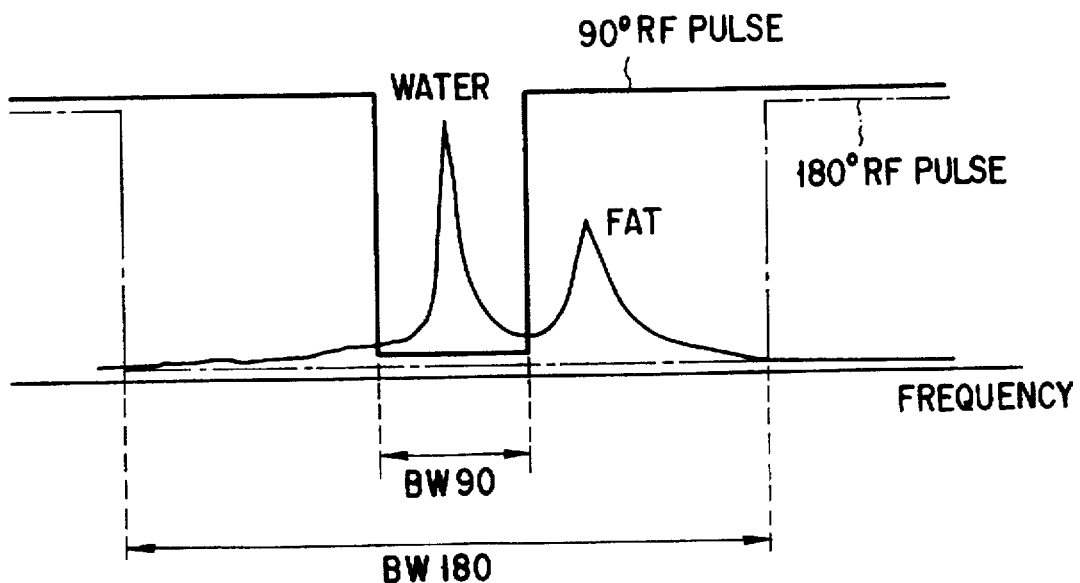
F I G. 6

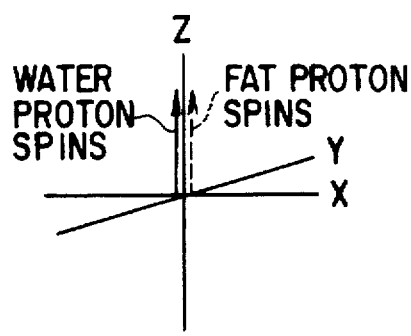
F I G. 8A
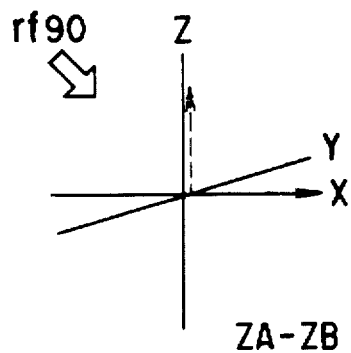
F I G. 8B
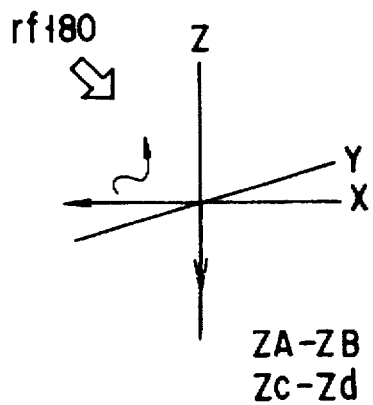
F I G. 8C
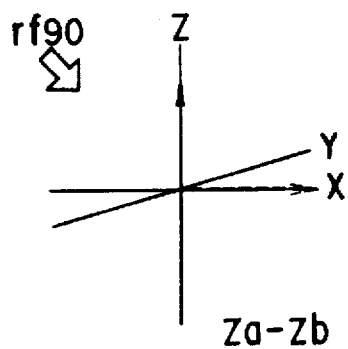
F I G. 8D
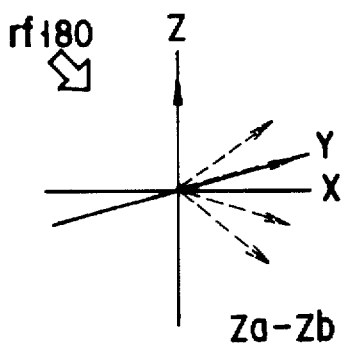
F I G. 8E

MAGNETIC RESONANCE IMAGING APPARATUS WITH FAT SIGNAL SUPPRESSION

BACKGROUND OF THE INVENTION

1. Field of the Invention

The present invention relates to a magnetic resonance imaging apparatus which collects an echo by applying a 90° rf pulse and a 180° rf pulse in turn to a human body under examination and reconstructs an MR image from the echo.

2. Description of the Related Art

The CHESS method and the Dixon method were developed to suppress fat components in MR images. The CHESS method uses a chemical shift selective pulse, which does not excite proton spins in water but excites only proton spins in fat. A gradient field is applied after that pulse in order to dephase excited proton spins in fat sufficiently. The sufficiently dephased proton spins in fat will not produce an echo. For this reason, a fat-suppressed image is obtained by carrying out a spin-echo imaging pulse sequence after proton spins in fat have been dephased sufficiently.

The Dixon method is an improved spin-echo imaging pulse sequence. There is a gap $\Delta t$ between the time that a 180° rf pulse is applied and the center of the time interval between a 90° rf pulse and an echo signal. $\Delta t$ depends on the chemical shift of fat. The proton spins in water and the proton spins in fat become 180° out of phase with each other at echo acquisition time. The echo signal at this time produces an out-of-phase image of water minus fat. In addition, a normal spin-echo imaging pulse sequence in which $\Delta t=0$ is carried out to obtain an in-phase image of water plus fat. The out-of-phase image and the in-phase image are summed to obtain a fat-free image.

The two methods described above undesirably require a long imaging time.

FIG. 1 shows a conventional spin-echo imaging pulse sequence for fat suppression, and FIG. 2 show spatial regions in which water proton spins and fat proton spins are affected by 90° and 180° rf pulses. FIGS. 3A to 3F show the behavior of proton spins in the respective regions. In FIG. 2, RF90(water) shows spatial variations in the resonance frequency of water which correspond to spatial variations in the strength of a first slice-selective gradient magnetic field that is generated simultaneously with a 90° rf pulse. RF180(fat) shows spatial variations in the resonant frequency of fat which correspond to spatial variations in the strength of a second slice-selective gradient magnetic field that is generated simultaneously with a 180° rf pulse. The first and second slice-selective gradient magnetic field are of the same polarity. Water proton spins within the region (ZA–ZB) are subjected to a 90° rf pulse. Water proton spins within the region (ZC–ZD) are subjected to a 180° rf pulse. Fat proton spins within the region (Za–Zb) are subjected to a 90° rf pulse. Fat proton spins within the region (Zc–Zd) are subjected to a 180° rf pulse. The frequency bandwidth BW90 of the 90° rf pulse is adjusted so that the region (ZA–ZB) and the region (Za–Zb) will not overlap each other. In order for the region (Za–Zb) and the region (Zc–Zd) not to overlap each other, the magnitude of a current applied to the gradient filed coil is increased to increase the spatial gradient of the strength of the second slice-selective gradient magnetic field and the frequency bandwidth BW180 of the 180° pulse is adjusted. If the region (Za–Zb) and the region (Zc–Zd) do not overlap each other, that is, if there are no fat proton spins that are subjected to both the 90° and 180° pulses, then no echo will be produced from the fat proton spins and hence fat will be suppressed in MR imaging.

In order to suppress fat successfully, it is required that the region (Za–Zb) and the region (Zc–Zd) should not overlap each other as shown in FIG. 2. This is effected by increasing the magnitude of current applied to the gradient field coil to increase the spatial gradient of the strength of the second slice-selective gradient magnetic field. However, a power source having high-output capabilities is very expensive and so an inexpensive power source that is relatively low in output capabilities is used. Such an inexpensive power source will produce a small overlap region between the region (Za–Zb) and the region (Zc–Zd) and allow fat proton spins existing within the overlap region to produce echoes.

SUMMARY OF THE INVENTION

It is therefore an object of the present invention to provide a magnetic resonance imaging apparatus which can suppress fat components successfully.

According to an aspect of the invention there is provided a magnetic resonance imaging apparatus comprising: static magnetic field forming means; transmitter/receiver means for transmitting an excitation radio frequency pulse and a refocusing radio frequency pulse in turn to a human body under examination and receiving a magnetic resonance signal generated in the human body under examination; gradient magnetic field forming means for forming a first slice selection gradient magnetic field simultaneously with the excitation radio frequency pulse and a second slice selection gradient magnetic field simultaneously with the refocusing radio frequency pulse; image reconstructing means for reconstructing an image from the magnetic resonance signal; and means for visualizing the image, wherein the transmitter/receiver means sets the frequency bandwidth of the excitation radio frequency pulse so that a region in which proton spins in water are excited and a region in which proton spins in fat are excited will not overlap each other, and wherein the gradient magnetic field forming means makes the second slice selection gradient magnetic field opposite in polarity to the first slice selection gradient magnetic field.

According to another aspect of the invention there is provided a magnetic resonance imaging apparatus comprising: static magnetic field forming means; transmitter/receiver means for transmitting an excitation radio frequency pulse and a refocusing radio frequency pulse in turn to a human body under examination and receiving a magnetic resonance signal generated in the human body under examination; gradient magnetic field forming means for forming a first slice selection gradient magnetic field simultaneously with the excitation radio frequency pulse and a second slice selection gradient magnetic field simultaneously with the refocusing radio frequency pulse; image reconstructing means for reconstructing a magnetic resonance image from the magnetic resonance signal; and means for visualizing the image, wherein the transmitter/receiver means sets the frequency bandwidth BW1 of the excitation radio frequency pulse and the frequency bandwidth BW2 of the refocusing radio frequency pulse so as to satisfy $$BW1 < BW2$$

$$1/BW1 + 1/BW2 > \alpha/\Delta Fcs^{-1}$$

where $0.7 \leq \alpha \leq 1.0$ and $\Delta Fcs$ is the chemical shift of proton spins in water and fat, and wherein the gradient magnetic field forming means makes the second slice selection gradient magnetic field opposite in polarity to the first slice selection gradient magnetic field.

According to still another aspect of the invention there is provided a magnetic resonance imaging apparatus comprising: static magnetic field forming means; transmitter/receiver means for transmitting an excitation radio frequency pulse and a refocusing radio frequency pulse in turn to a human body under examination and receiving a magnetic resonance signal generated in the human body under examination; gradient magnetic field forming means for forming a first slice selection gradient magnetic field simultaneously with the excitation radio frequency pulse and a second slice selection gradient magnetic field simultaneously with the refocusing radio frequency pulse; image reconstructing means for reconstructing an image from the magnetic resonance signal; and means for visualizing the image, wherein the transmitter/receiver means sets the frequency bandwidth of the excitation radio frequency pulse narrower than that of the refocusing radio frequency pulse and makes the time interval between the excitation radio frequency pulse and the refocusing radio frequency pulse and the time interval between the refocusing radio frequency pulse and the magnetic resonance signal differ from each other so that proton spins in unsaturated fat and proton spins in saturated fat become opposite in phase to each other at the time of reception of the magnetic resonance signal, and wherein the gradient magnetic field forming means makes the second slice selection gradient magnetic field opposite in polarity to the first slice selection gradient magnetic field.

Proton spins that have been subjected to both the excitation radio frequency pulse and the refocusing radio frequency pulse produce an echo. However, proton spins that have been subjected to only one of the pulses will not produce an echo.

In the invention, the second slice selection gradient magnetic field pulse is of the opposite polarity to the first slice selection gradient magnetic field pulse. The region in which fat proton spins are excited by the excitation radio frequency pulse shows a tendency to spatially leave the region in which fat proton spins are refocused by the refocusing radio frequency pulse. In the prior art in which the first and second slice selection gradient magnetic fields are of the same polarity, the two regions show a tendency to approach each other. Fat proton spins in a region where the two regions overlap produce an echo. In the invention, the size of the overlapping region is made much smaller than in the prior art. For this reason, the invention permits the effect of suppressing fat to be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a schematic representation of a magnetic resonance imaging apparatus of the invention;

FIG. 5 shows a spin-echo imaging pulse sequence adapted for fat suppression according to an embodiment of the invention;

FIG. 6 shows the frequency bandwidths of adjusted 90° and 180° rf pulses and the spectrum of proton spins within a slice;

FIGS. 8A to 8E show the behavior of proton spins in the respective regions of FIG. 7;

DETAILED DESCRIPTION OF THE PREFERRED EMBODIMENTS

Figure 1:
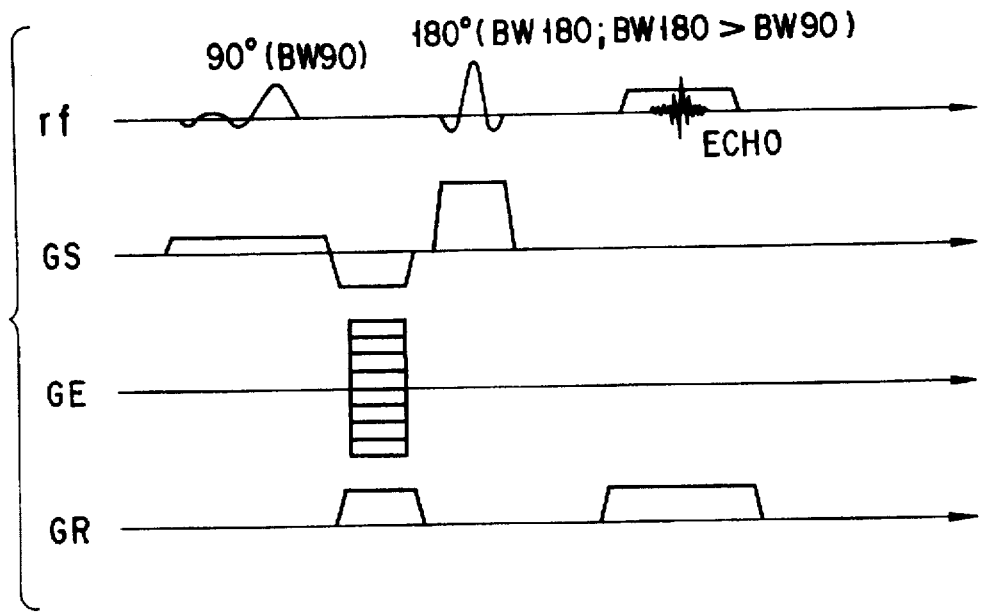
FIG. 1 shows a conventional spin-echo imaging pulse sequence adapted for fat suppression.

Referring now to FIG. 4, there is shown a magnetic resonance imaging apparatus of the invention, which includes a coil assembly 20 having a space in the form of a cylinder. Imaging, i.e., echo sampling, is carried out within the space. A human body P under examination is laid down on a couch 13 and allowed to have access to the space within the coil assembly 20. The coil assembly 20 has a static magnetic field forming magnet 1, a gradient magnetic field forming coil 2, and an rf coil 3. The static field forming magnet 1 may be either a superconducting magnet or a non-superconducting magnet. The static field forming magnet 1 produces a static magnetic field within the cylindrical space. The gradient field forming coil 2 is responsive to a pulse current from an X-axis gradient field power supply 7 to produce a readout gradient magnetic field pulse. Moreover, the gradient field producing coil 2 is responsive to a pulse current from a Y-axis gradient field power supply 8 to produce a phase encoding gradient magnetic field pulse. Furthermore, the gradient field forming coil 2 is responsive to a pulse current from a Z-axis gradient field power supply 9 to produce a slice selecting gradient magnetic field pulse. When the polarity of a pulse current from the Z-axis gradient field power supply 9 is changed, the polarity of the slice selecting gradient magnetic field pulse, i.e., the direction of the spatial gradient of the intensity of the slice selecting gradient magnetic field, is reversed. The polarity of a pulse current from the Z-axis gradient field power supply 9 is determined by a waveform control signal from a sequencer 10.

The rf coil 3 receives pulse currents from a transmitter 5 to produce an excitation radio frequency pulse (hereinafter referred to as a 90° rf pulse) and a refocusing radio frequency pulse (hereinafter referred to as a 180° rf pulse). The frequency bandwidth of each of the 90° and 180° pulses depends on the waveform of a corresponding respective pulse current outputted from the transmitter 5. The waveform of a pulse current is controlled by a waveform control signal from the sequencer 10.

A receiver 6 receives a magnetic resonance signal produced within the human body, an echo signal herein, through the rf coil 3. The receiver 6 amplifies the echo signal received and then converts it into a digital signal. A single rf coil 3 may be used for both transmission and reception. Alternatively, two separate rf coils—one for transmission and the other for reception—may be provided.

A computer system 11 reconstructs a magnetic resonance image from an echo signal outputted from the receiver 6. A display unit 12 visually displays the reconstructed magnetic resonance image. The sequencer 10 controls the timing of operations of the transmitter 5, the receiver 6, and the gradient field power supplies 7, 8 and 9. The sequencer also feeds a waveform control signal to each of the transmitter 5 and the gradient field power supplies 7, 8 and 9 to thereby adjust the pulse current waveform outputted from it.

FIG. 5 shows a spin-echo imaging pulse sequence according to an embodiment of the invention. In the first place, a 90° rf pulse is produced. Next, a 180° rf pulse is produced TE/2 after the center of the 90° rf pulse. The TE is the echo time. The 90° rf pulse is shaped to have an asymmetrical waveform corresponding to the (sinc) function. An echo is received TE the center of the 90°. A first slice selecting gradient magnetic field pulse G90 is produced simultaneously with the 90° rf pulse. A second slice selecting gradient magnetic field pulse G180 is produced simultaneously with the 180° rf pulse. A phase encoding gradient magnetic field pulse GE is produced before the echo is received. The amplitude of the phase encoding gradient magnetic field pulse GE is varied little by little each time a 90° rf pulse is produced. During the reception of the echo, a readout gradient magnetic field pulse GR is produced.

Figure 7:
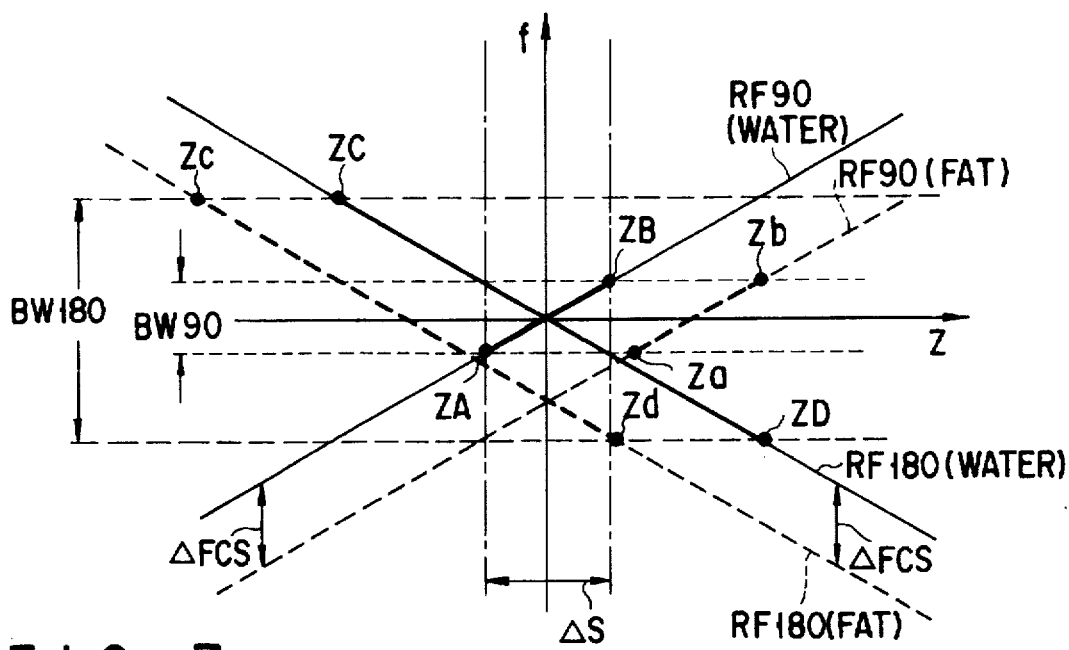
FIG. 7 shows spatial regions in which water proton spins and fat proton spins are affected by the 90° and 180° rf pulses of FIG. 6.

FIG. 6 shows the spectrum of proton spins within a slice and the frequency bandwidths of the 90° and 180° rf pulses. FIGS. 8A to 8E show the behavior of proton spins in the respective regions shown in FIG. 7. In FIG. 7, RF90(water) shows spatial variations in the resonance frequency of water proton spins that correspond to spatial variations in the strength of the first slice selecting gradient magnetic field pulse G90 produced simultaneously with the 90° rf pulse. RF180(fat) shows spatial variations in the resonance frequency of fat proton spins that correspond to spatial variations in the strength of the second slice selecting gradient magnetic field pulse G180 produced simultaneously with the 180° rf pulse G180. BW90 shows the frequency bandwidth of the 90° rf pulse. BW180 shows the frequency bandwidth of the 180° rf pulse. $\Delta Fcs$ shows the difference between water and fat chemical shifts. $\Delta S$ shows the thickness of a slice.

Water proton spins within the region (ZA–ZB) are irradiated with the 90° rf pulse, then excited. Water proton spins within the region (ZC–ZD) are irradiated with the 180° rf pulse, then refocused. Fat proton spins within the region (Za–Zb) are irradiated with the 90° rf pulse, then excited. Fat proton spins within the region (Zc–Zd) are irradiated with the 180° rf pulse, then refocused.

The frequency bandwidth of the 90° rf pulse is adjusted so that the region (ZA–ZB) in which water proton spins are excited by that pulse and the region (Za–Zb) in which fat proton spins are excited by the pulse will not overlap each other.

Figure 2:
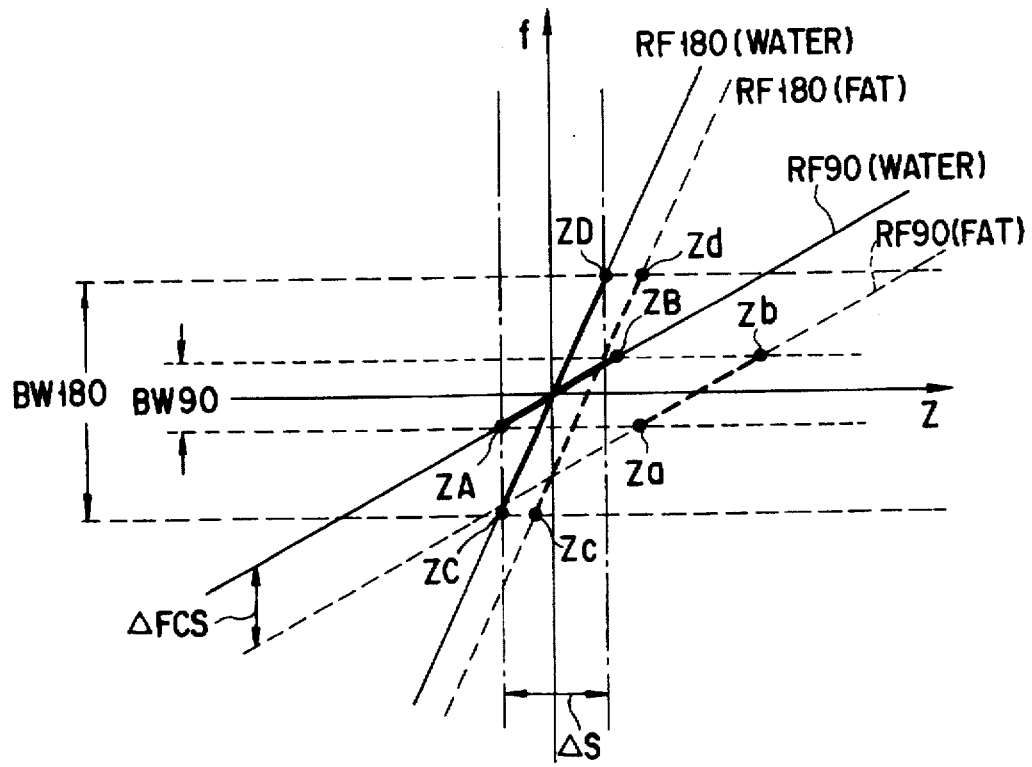
FIG. 2 shows spatial regions in which water proton spins and fat proton spins are affected by the 90° and 180° rf pulses of FIG. 1.
Figure 3A:
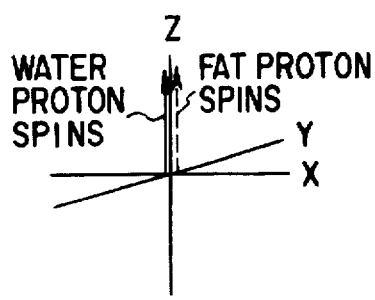
FIGS. 3A to 3F show the behavior of proton spins in the respective regions shown in FIG. 2.
Figure 3B:
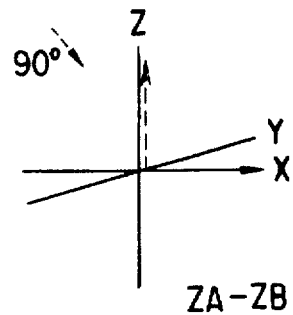
Figure 3C:
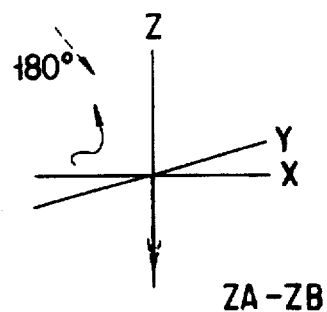
Figure 3D:
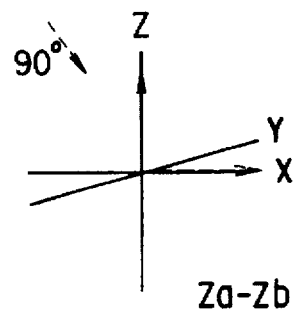
Figure 3E:
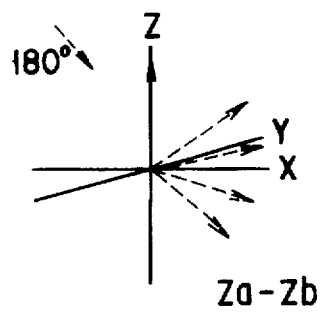
Figure 3F:
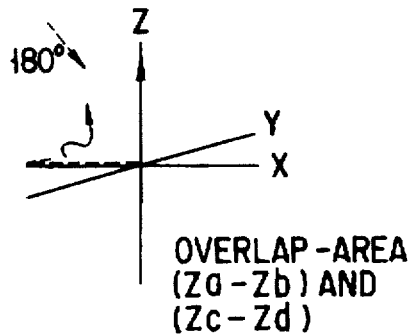

Proton spins that have been subjected to both the 90° and 180° rf pulses produce an echo. The frequency bandwidth BW90 of the 90° rf pulse is set narrower than the frequency bandwidth BW180 of the 180° rf pulse (BW180>BW90) so that all of water proton spins that have been subjected to the 90° rf pulse will also be subjected to the 180° rf pulse. In other words, the polarity of the second slice selecting gradient magnetic field pulse G180 is made opposite to that of the first slice selecting gradient magnetic field pulse G90. Thereby, the slope of spatial variations in the strength of the first slice selecting gradient magnetic field pulse G90 and the slope of spatial variations in the strength of the second slice selecting gradient magnetic field pulse G180 are oriented in the opposite directions. As can been seen from comparison between FIG. 2 and FIG. 7, this produces a tendency to keep spatially each of the region (Za–Zb) in which fat proton spins are excited by the 90° rf pulse and the region in which fat proton spins are excited by the 180° rf pulse away from the other.

The complete suppression of fat is effected when the condition that the region (Za–Zb) in which fat proton spins are excited by the 90° rf pulse and the region in which fat proton spins are excited by the 180° rf pulse do not overlap each other is satisfied. The overlap ratio R of the region (Za–Zb) and the region (Zc–Zd) is given by equation (1).

$$R=(\Delta S-|\Delta Fcs/G90-\Delta Fcs/G180|)/\Delta S \tag{1}$$

where G90 represents the amplitude of the first slice selecting gradient magnetic field pulse and G180 represents the amplitude of the second slice selecting gradient magnetic field pulse.

Assume here that τ90 and τ180 are the length of lobe of the 90° rf pulse and the 180° rf pulse, respectively. Then, equations (2) and (3) will be given as follows:

$$|G90|=\tau 90/\Delta S \tag{2}$$

$$|G180|=\tau 180/\Delta S \tag{3}$$

The length of lobe and the frequency bandwidth are related such that the longer the length of lobe is, the narrower the frequency bandwidth becomes. Equations (2) and (3) show that the slice thickness $\Delta S$ depends on the frequency bandwidth and the amplitude of the slice selecting gradient magnetic field pulse.

Substituting equations (2) and (3) into equation (1) yields $$R=1-|\Delta Fcs \cdot (\tau 90+\tau 180)| \tag{4}$$

Provided that R<0, fat can be suppressed completely. That is, if R<0, then the region (Za–Zb) and the region (Zc–Zd) will not overlap each other and there will exist no fat proton spins that are subjected to both the 90° rf pulse and the 180° rf pulse. Thus, fat proton spins will not produce echoes.

It should be noted here that, in equation (4), there appears (τ90+τ180), not (τ90−τ180). This is due to the fact that the polarity of the second slice selecting gradient magnetic field pulse G180 is opposite to that of the first slice selecting gradient magnetic field pulse G90. And this means that τ90 and τ180 act cooperatively to satisfy the condition that R<0. Further, this means that fat can be suppressed sufficiently even if, unlike the prior art, the amplitude of the second slice selecting gradient magnetic field pulse G180 is not made very large in comparison with the amplitude of the first slice selecting gradient magnetic field pulse G90.

From the above results, the following conditions under which fat is suppressed completely and efficiently will be obtained:

(1) $BW90 < BW180 \; (= \tau 90 > \tau 180)$ (2) $G90 = -G180$ (3) $\tau 90 + \tau 180 > \Delta Fcs^{-1}$ When the strength of the static magnetic field is 0.5 T, the chemical shift is 74 Hz. In order to achieve R<0, it is required that $\tau 90 + \tau 180 > 13.5$ ms. When the strength of the static magnetic field is 1.0 T, the chemical shift is 147 Hz. In order to achieve R<0, it is required that $\tau 90 + \tau 180 > 6.8$ ms. When the strength of the static magnetic field is 1.5 T, the chemical shift is 222 Hz. In order to achieve R<0, it is required that $\tau 90 + \tau 180 > 4.5$ ms.

Note that condition (3) may be modified such that $\tau 90 + \tau 180 > \alpha \times \Delta Fcs^{-1}$ where $0.7 \leq \alpha \leq 1.0$. This means that even 70 percent of the fat suppressing effect is practically sufficiently allowable.

By satisfying the three conditions, fat can be suppressed completely and efficiently.

Figure 11:
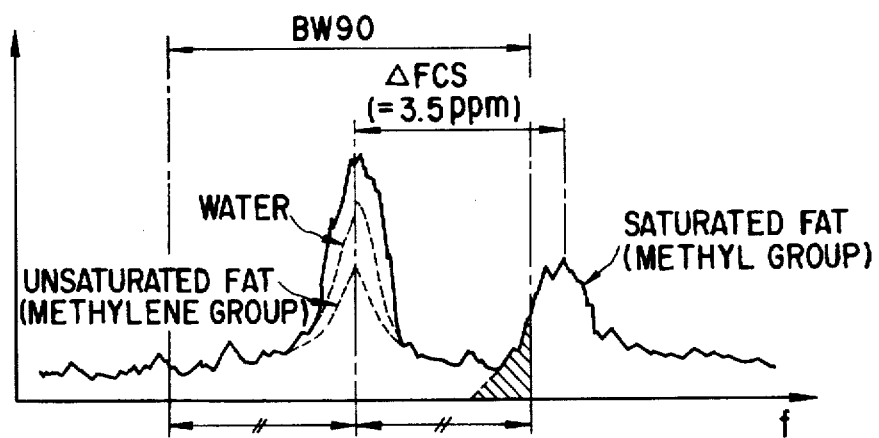
FIG. 11 shows the frequency bandwidth of the 90° rf pulse and the spectrum of proton spins in the vicinity of the position Za of FIG. 10.

FIG. 11 shows the frequency bandwidth BW90 of the 90° rf pulse and the spectrum of proton spins in the vicinity of the edge ZB of a slice. In practice, the spectrum of proton spins is not so sharp but is broadened to some extent. Thus, fat will remain a little even if the three above-described conditions are satisfied. In FIG. 11, the remaining fat is shown shaded. For example, at 0.5 T and with $\tau 90 = 8.5$ ms and $\tau 180 = 3.0$ ms, 14.8 percent of fat will remain.

Fat contains methylene-group unsaturated fat and methyl-group saturated fat. The fat in the above description corresponds to saturated fat. The resonant frequency of unsaturated fat approximates to the resonant frequency of water. Conventionally, it has been considered impossible to suppress unsaturated fat.

Figure 9:
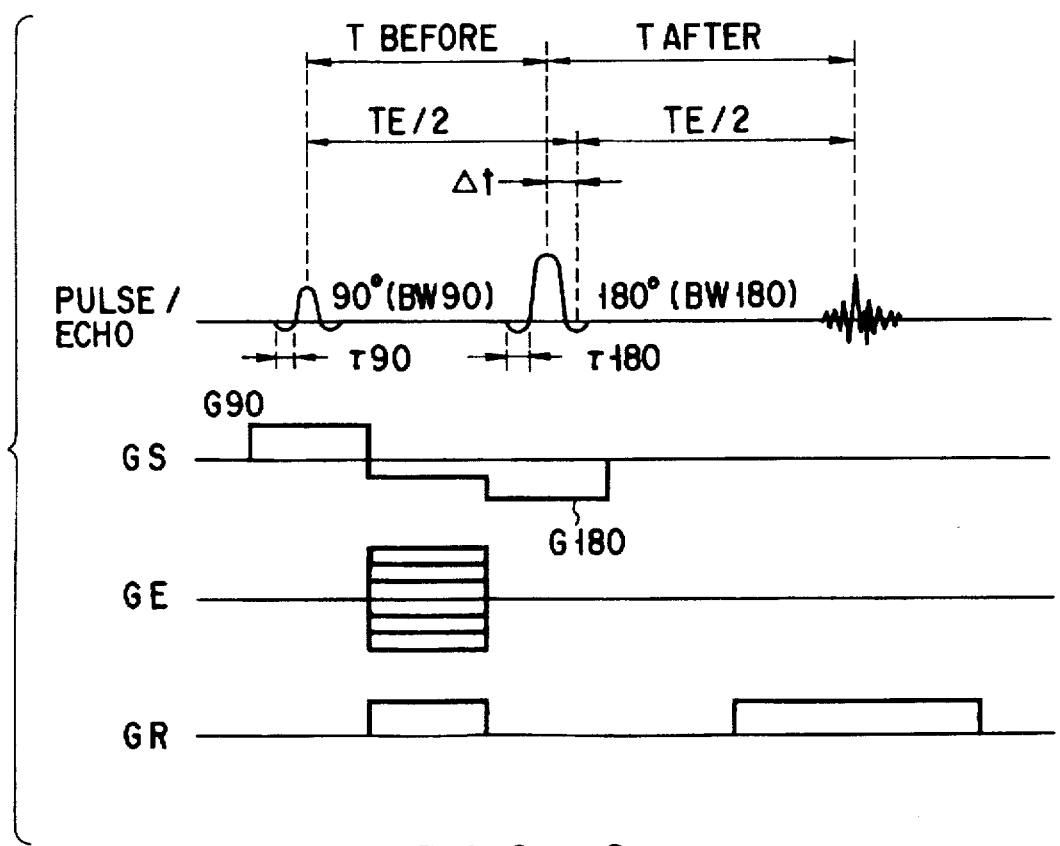
FIG. 9 shows a spin-echo imaging pulse sequence according to another embodiment of the invention.
Figure 10:
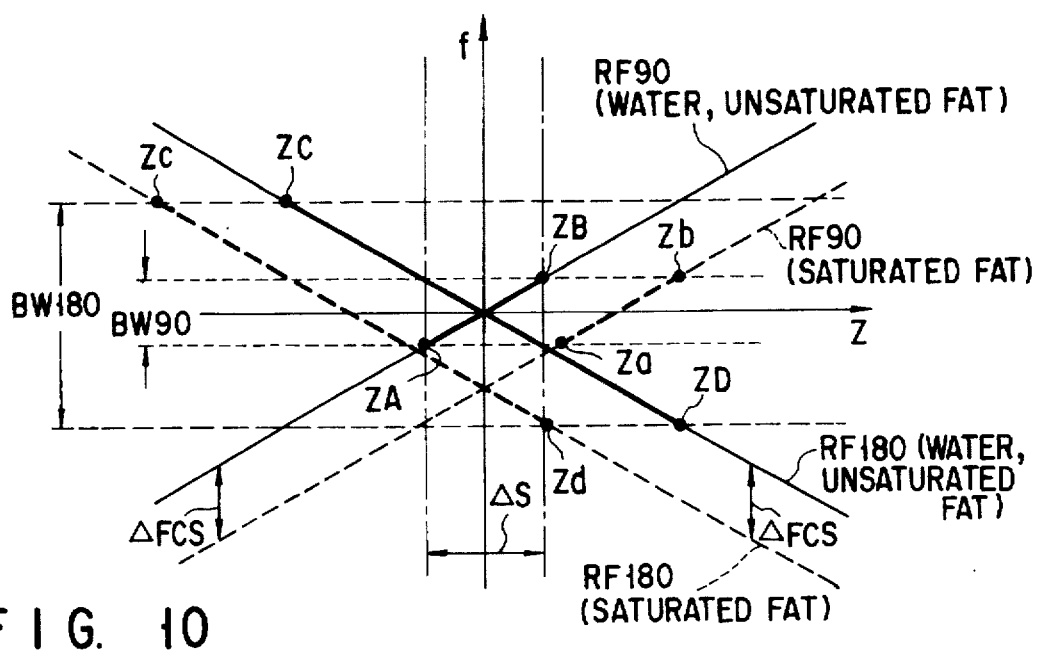
FIG. 10 shows spatial regions in which water proton spins and fat proton spins are affected by the 90° and 180° rf pulses of FIG. 9.
Figure 12:
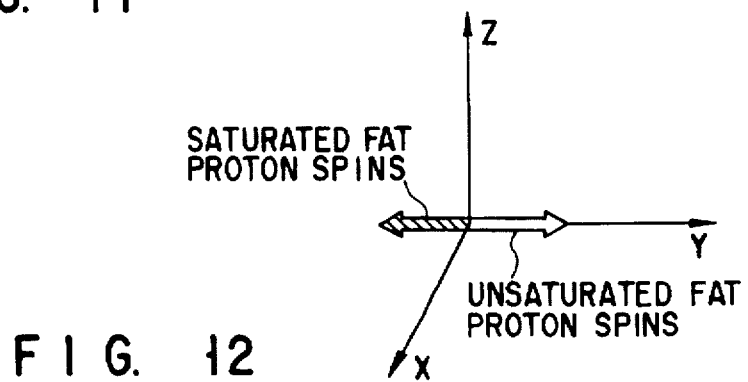
FIG. 12 shows the phase difference between proton spins in unsaturated fat and proton spins in saturated fat at the echo center.

FIG. 9 shows a spin-echo imaging pulse sequence according to a second embodiment of the invention which is further improved to suppress remaining fat and moreover unsaturated fat. FIG. 10 shows the spectrum of proton spins within a slice and the frequency bandwidth of the 90° rf pulse in the pulse sequence of FIG. 9. FIG. 12 shows the phase difference between proton spins in unsaturated fat and proton spins in saturated fat at the echo center.

In the pulse sequence of FIG. 5, the 180° rf pulse is produced TE/2 after the 90° rf pulse. In the further improved pulse sequence of FIG. 9, a time difference $\Delta t$ is introduced between the 180° rf pulse and the time after a lapse of TE/2 from the 90° rf pulse. This makes the time interval between the 90° rf pulse and the 180° rf pulse differ from the time interval between the 180° rf pulse and the echo center. The difference between the time intervals is $2 \times \Delta$.

The time difference $\Delta t$ is adjusted so that, at the echo center, the proton spins in unsaturated fat and the proton spins in saturated fat become 180° out of phase with each other.

Echoes from the proton spins in unsaturated fat and echoes from the proton spins in saturated fat become opposite in phase to each other, whereby both types of echoes are canceled out or suppressed.

Thus, the improved pulse sequence of FIG. 9 can suppress not only remaining saturated fat but also unsaturated fat.

Figure 13:
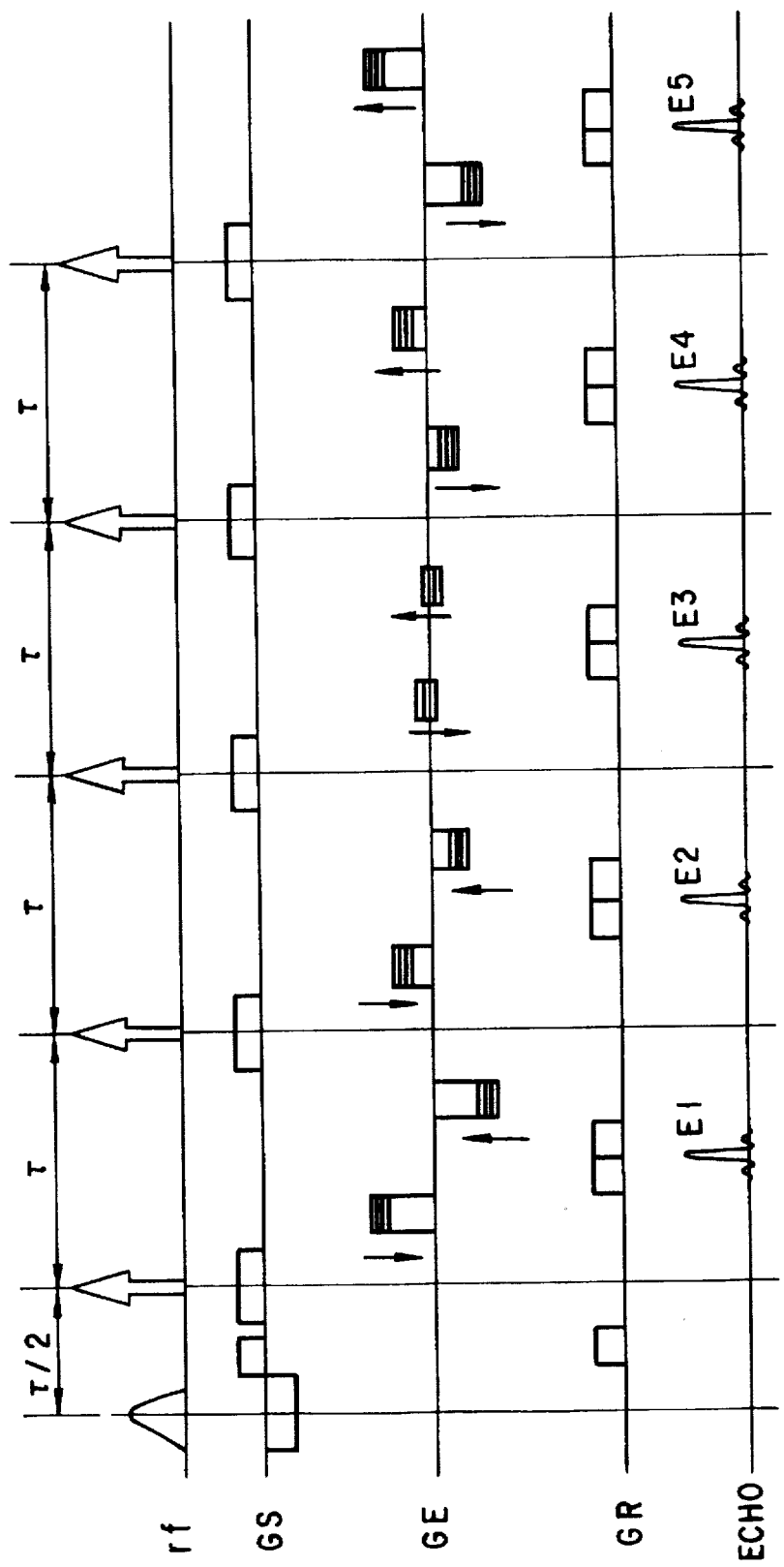
FIG. 13 shows a FAST-SE imaging pulse sequence to which the invention is applied.
Figure 14:
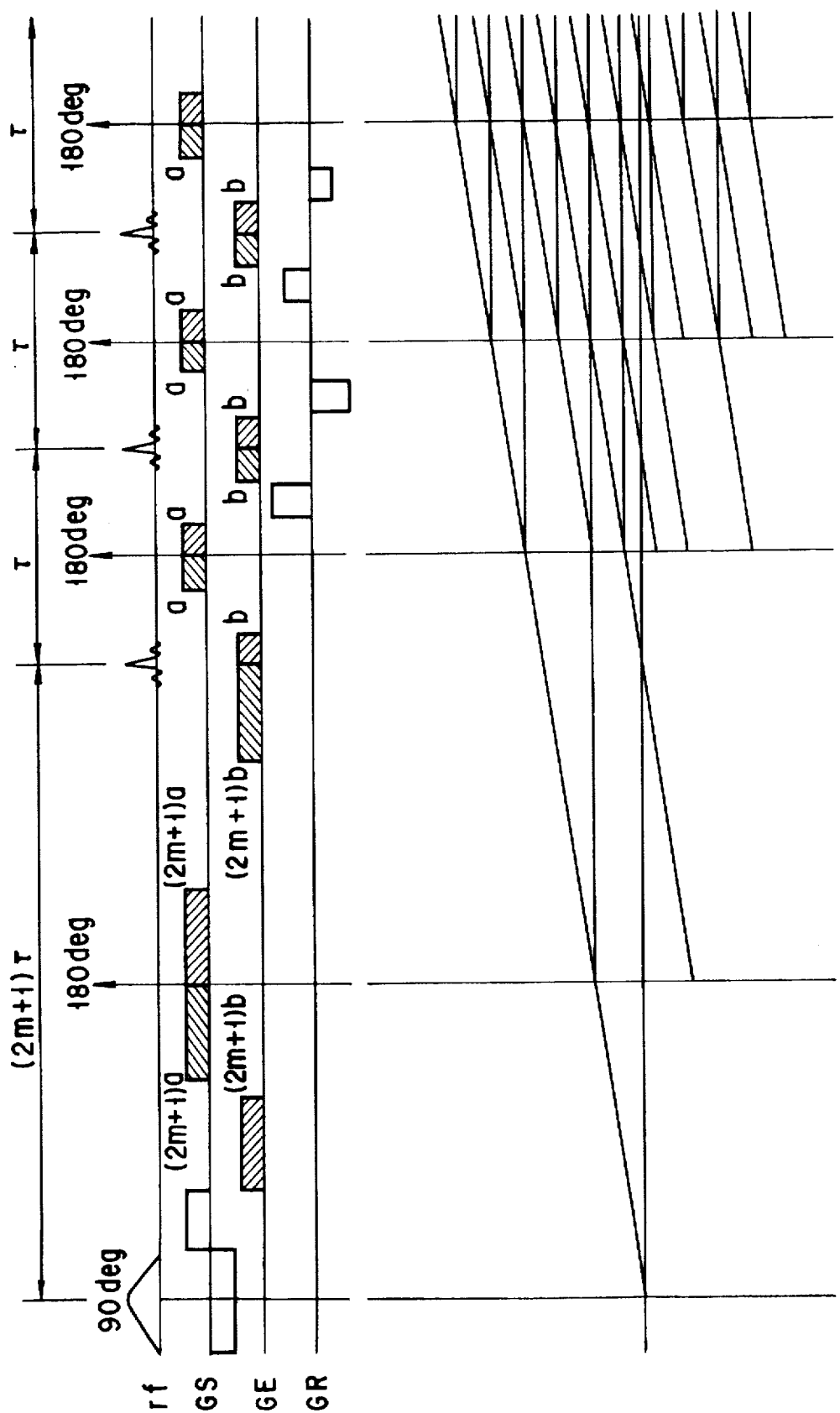
FIG. 14 shows a DIET-SE imaging pulse sequence to which the invention is applied.
Figure 15:
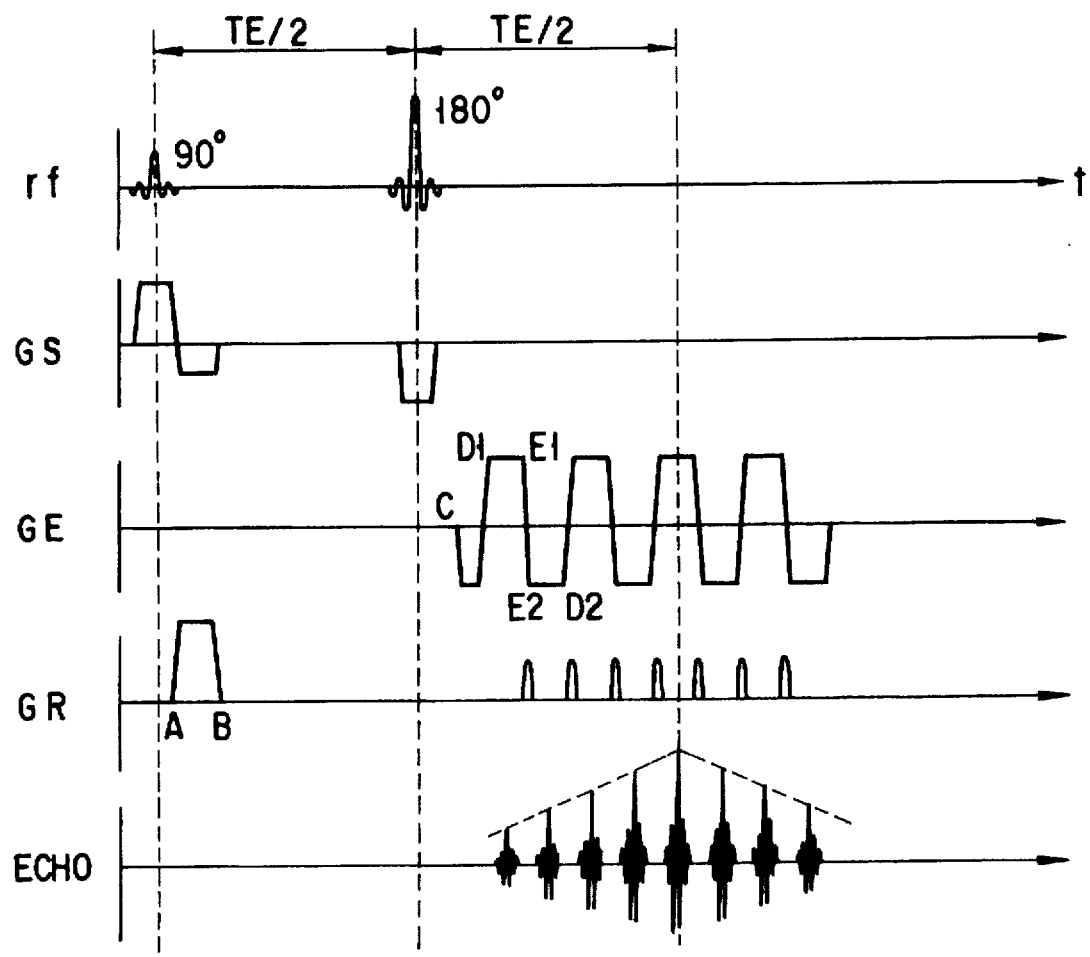
FIG. 15 shows an EPI imaging pulse sequence to which the invention is applied.
Figure 16:
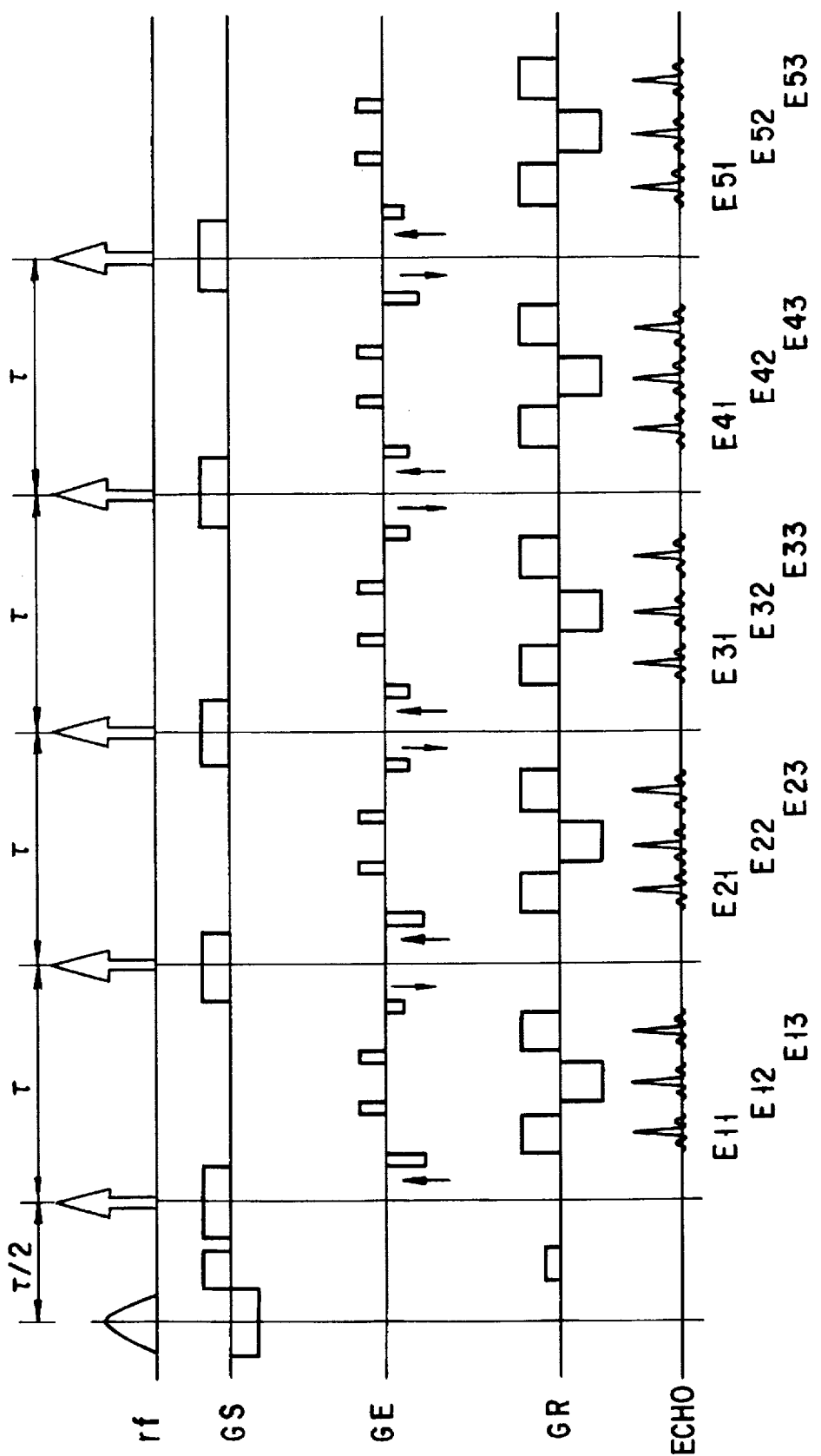
FIG. 16 shows a GRASE imaging pulse sequence to which the invention is applied.

The present invention is not limited to the above-described embodiments but may be practiced or embodied in still other ways. In the above description, the invention was described as using the 2DFT (two-dimensional Fourier transform) method. The 3DFT (three-dimensional Fourier transform) method may also be used. The invention can be applied to almost all of pulse sequences that generate echoes. FIG. 13 shows a Fast-SE imaging pulse sequence to which the invention is applied. FIG. 14 shows a DIET-SE imaging pulse sequence to which the invention is applied. FIG. 15 shows an EPI (echo planar imaging) imaging pulse sequence to which the invention is applied. FIG. 16 shows a GRASE imaging pulse sequence to which the invention is applied. In the Fast-SE imaging pulse sequence, in order to generate an echo a plurality of times, application of a 180° rf pulse is carried out repeatedly after a single 90° rf pulse. The DIET-SE imaging pulse sequence is improved over the Fast-SE imaging pulse sequence such that the echo time of the first echo is an odd multiple (three or more) of the time interval between two adjacent echoes. In the EPI imaging pulse sequence, a polarity-alternating readout gradient magnetic field is applied after a 180° rf pulse to thereby acquire a plurality of echoes in sequence. The GRASE imaging pulse sequence is a combination of the FAST-SE imaging pulse sequence and the EPI pulse sequence. Further, the invention may be applied to Dynamic MR Mamography.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus comprising:

static magnetic field forming means;

transmitter/receiver means for transmitting an excitation radio frequency pulse and a refocusing radio frequency pulse in turn to a human body under examination and receiving a magnetic resonance signal generated in said human body under examination;

gradient magnetic field forming means for forming a first slice selection gradient magnetic field simultaneously with said excitation radio frequency pulse and a second slice selection gradient magnetic field simultaneously with said refocusing radio frequency pulse;

image reconstructing means for reconstructing an image from said magnetic resonance signal; and means for visualizing said image, wherein said transmitter/receiver means sets the frequency bandwidth of said excitation radio frequency pulse so that a region in which proton spins in water are excited and a region in which proton spins in fat are excited will not overlap each other, and wherein said transmitter/receiver means sets the frequency bandwidth of said excitation radio frequency pulse narrower than that of said refocusing radio frequency pulse, and wherein said gradient magnetic field forming means makes said second slice selection gradient magnetic field opposite in polarity to said first slice selection gradient magnetic field.

2. The apparatus according to claim 1, wherein said transmitter/receiver means sets the frequency bandwidth of said excitation radio frequency pulse and the frequency bandwidth of said refocusing radio frequency pulse so that a region in which proton spins in fat are excited by said excitation radio frequency pulse and a region in which proton spins in fat are refocused by said refocusing radio frequency pulse will not overlap each other.

3. The apparatus according to claim 1, wherein said transmitter/receiver means sets the frequency bandwidth of said excitation radio frequency pulse and the frequency bandwidth of said refocusing radio frequency pulse so that a region in which proton spins in water are excited by said excitation radio frequency pulse is included in a region in which proton spins in fat are refocused by said refocusing radio frequency pulse.

4. The apparatus according to claim 1, wherein said gradient magnetic field forming means sets the amplitude of said second slice selection gradient magnetic field higher than the amplitude of said first slice selection gradient magnetic field.

5. The apparatus according to claim 1, wherein said gradient magnetic field forming means sets the amplitude of said first slice selection gradient magnetic field and the amplitude of said second slice selection gradient magnetic field so that a region in which proton spins in fat are excited by said excitation radio frequency pulse and a region in which proton spins in fat are refocused by said refocusing radio frequency pulse will not overlap each other.

6. The apparatus according to claim 1, wherein said gradient magnetic field forming means sets the amplitude of said first slice selection gradient magnetic field and the amplitude of said second slice selection gradient magnetic field so that a region in which proton spins in water are excited by said excitation radio frequency pulse is included in a region in which proton spins in water are refocused by said refocusing radio frequency pulse.

7. The apparatus according to claim 1, wherein said transmitter/receiver means transmits said refocusing radio frequency pulse repeatedly and receives said magnetic resonance signal repeatedly.

8. The apparatus according to claim 1, wherein said gradient magnetic field forming means forms a polarity-alternating readout gradient magnetic field after said refocusing radio frequency pulse, and wherein said transmitter/receiver means receives said magnetic resonance signal repeatedly.

9. The apparatus according to claim 1, wherein said transmitter/receiver means makes the time interval between said excitation radio frequency pulse and said refocusing radio frequency pulse and the time interval between said refocusing radio frequency pulse and said magnetic resonance signal differ from each other so that proton spins in unsaturated fat and proton spins in saturated fat become opposite in phase to each other at the time of reception of said magnetic resonance signal.

10. A magnetic resonance imaging apparatus comprising:
static magnetic field forming means;
transmitter/receiver means for transmitting an excitation radio frequency pulse and a refocusing radio frequency pulse in turn to a human body under examination and receiving a magnetic resonance signal generated in said human body under examination;
gradient magnetic field forming means for forming a first slice selection gradient magnetic field simultaneously with said excitation radio frequency pulse and a second slice selection gradient magnetic field simultaneously with said refocusing radio frequency pulse;
image reconstructing means for reconstructing a magnetic resonance image from said magnetic resonance signal; and means for visualizing said image.
wherein said transmitter/receiver means sets the frequency bandwidth BW1 of said excitation radio frequency pulse and the frequency bandwidth BW2 of said refocusing radio frequency pulse so as to satisfy $BW1 < BW2$ $1/BW + 1/BW2 > \alpha/\Delta Fcs^{-1}$ where $0.7 \leq \alpha \leq 1.0$ and $\Delta Fcs$ is the chemical shift of proton spins in water and fat, and wherein said gradient magnetic field forming means makes said second slice selection gradient magnetic field opposite in polarity to said first slice selection gradient magnetic field.

11. The apparatus according to claim 10, wherein said gradient magnetic field forming means sets the amplitude of said second slice selection gradient magnetic field higher than the amplitude of said first slice selection gradient magnetic field.

12. The apparatus according to claim 10, wherein said transmitter/receiver means transmits said refocusing radio frequency pulse repeatedly and receives said magnetic resonance signal repeatedly.

13. The apparatus according to claim 10, wherein said gradient magnetic field forming means forms a polarity alternating readout gradient magnetic field after said refocusing radio frequency pulse, and wherein said transmitter/receiver means receives said magnetic resonance signal repeatedly.

14. The apparatus according to claim 10 wherein said transmitter/receiver means makes the time interval between said excitation radio frequency pulse and said refocusing radio frequency pulse and the time interval between said refocusing radio frequency pulse and said magnetic resonance signal differ from each other so that proton spins in unsaturated fat and proton spins in saturated fat become opposite in phase to each other at the time of reception of said magnetic resonance signal.

15. A magnetic resonance imaging apparatus comprising:
static magnetic field forming means;
transmitter/receiver means for transmitting an excitation radio frequency pulse and a refocusing radio frequency pulse in turn to a human body under examination and receiving a magnetic resonance signal generated in said human body under examination;
gradient magnetic field forming means for forming a first slice selection gradient magnetic field simultaneously with said excitation radio frequency pulse and a second slice selection gradient magnetic field simultaneously with said refocusing radio frequency pulse;
image reconstructing means for reconstructing an image from said magnetic resonance signal; and
means for visualizing said image,
wherein said transmitter/receiver means sets the frequency bandwidth of said excitation radio frequency pulse narrower than that of said refocusing radio frequency pulse and makes the time interval between said excitation radio frequency pulse and said refocusing radio frequency pulse and the time interval between said refocusing radio frequency pulse and said magnetic resonance signal differ from each other so that proton spins in unsaturated fat and proton spins in saturated fat become opposite in phase to each other at the time of reception of said magnetic resonance signal, and wherein said gradient magnetic field forming means makes said second slice selection gradient magnetic field opposite in polarity to said first slice selection gradient magnetic field.

16. The apparatus according to claim 15, wherein said transmitter/receiver means sets the frequency bandwidth of said excitation radio frequency pulse narrower than that of said refocusing radio frequency pulse.

17. The apparatus according to claim 15, wherein said transmitter/receiver means sets the frequency bandwidth of said excitation radio frequency pulse and the frequency bandwidth of said refocusing radio frequency pulse so that a region in which proton spins in fat are excited by said excitation radio frequency pulse and a region in which proton spins in fat are refocused by said refocusing radio frequency pulse will not overlap each other.

18. The apparatus according to claim 15, wherein said transmitter/receiver means sets the frequency bandwidth of said excitation radio frequency pulse and the frequency bandwidth of said refocusing radio frequency pulse so that a region in which proton spins in fat are excited by said excitation radio frequency pulse is included in a region in which proton spins in water are refocused by said refocusing radio frequency pulse.

19. The apparatus according to claim 16, wherein said gradient magnetic field forming means sets the amplitude of said second slice selection gradient magnetic field higher than the amplitude of said first slice selection gradient magnetic field.

20. The apparatus according to claim 16, wherein said gradient magnetic field forming means sets the amplitude of said first slice selection gradient magnetic field and the amplitude of said second slice selection gradient magnetic field so that a region in which proton spins in fat are excited by said excitation radio frequency pulse and a region in which proton spins in fat are refocused by said refocusing radio frequency pulse will not overlap each other.

21. The apparatus according to claim 15, wherein said gradient magnetic field forming means sets the amplitude of said first slice selection gradient magnetic field and the amplitude of said second slice selection gradient magnetic field so that a region in which proton spins in water are excited by said excitation radio frequency pulse is included in a region in which proton spins in water are refocused by said refocusing radio frequency pulse.

22. The apparatus according to claim 15, wherein said transmitter/receiver means transmits said refocusing radio frequency pulse repeatedly and receives said magnetic resonance signal repeatedly.

23. The apparatus according to claim 15, wherein said gradient magnetic field forming means forms a polarity-alternating readout gradient magnetic field after said refocusing radio frequency pulse, and wherein said transmitter/receiver means receives said magnetic resonance signal repeatedly.

* * * * *